(12) United States Patent
Choi et al.

(10) Patent No.: US 12,417,897 B2
(45) Date of Patent: Sep. 16, 2025

(54) PLASMA PROCESSING APPARATUS AND PLASMA PROCESSING METHOD USING THE SAME

(71) Applicant: SEMES CO., LTD., Chungcheongnam-do (KR)

(72) Inventors: Yoon Seok Choi, Gyeonggi-do (KR); Soon Cheon Cho, Gyeonggi-do (KR); Sang Jeong Lee, Gyeonggi-do (KR); Hyun Woo Jo, Gyeonggi-do (KR); Jong Won Park, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 422 days.

(21) Appl. No.: 17/744,624

(22) Filed: May 14, 2022

(65) Prior Publication Data

US 2023/0124857 A1    Apr. 20, 2023

(30) Foreign Application Priority Data

Oct. 20, 2021  (KR) .................. 10-2021-0139978

(51) Int. Cl.
H01J 37/32    (2006.01)

(52) U.S. Cl.
CPC ..... *H01J 37/3211* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 5,849,136 A | * | 12/1998 | Mintz | H01J 37/32183 315/111.21 |
| 6,083,344 A | * | 7/2000 | Hanawa | H01J 37/32174 156/345.48 |
| 6,164,241 A | * | 12/2000 | Chen | H01J 37/321 427/569 |

(Continued)

FOREIGN PATENT DOCUMENTS

| | | | | |
|---|---|---|---|---|
| CN | 102056391 A | * | 5/2011 | ............ H01J 37/321 |
| CN | 112470552 | | 3/2021 | |

(Continued)

OTHER PUBLICATIONS

Office Action (1st) dated Jun. 20, 2025 for Chinese Patent Application No. 202210967398.0 and its English translation from Global Dossier.

*Primary Examiner* — Sylvia MacArthur
(74) *Attorney, Agent, or Firm* — WOMBLE BOND DICKINSON (US)

(57) ABSTRACT

A plasma processing apparatus is provided. The plasma processing apparatus includes a chamber having a processing space defined therein in which plasma is generated; and a plasma generation unit configured to excite gas in the processing space into a plasma state, wherein the plasma generation unit includes: a first power supply to supply power for generation of the plasma; a coil connected to the first power supply; a first shunt capacitor disposed between and connected to a first node of the coil and a ground; and a second shunt capacitor disposed between and connected to a second node other than the first node of the coil and the ground.

13 Claims, 5 Drawing Sheets

(56) References Cited

U.S. PATENT DOCUMENTS

| | | | |
|---|---|---|---|
| 6,409,933 B1* | 6/2002 | Holland | H01J 37/321 |
| | | | 343/893 |
| 6,507,155 B1* | 1/2003 | Barnes | H01J 37/321 |
| | | | 315/111.21 |
| 6,652,712 B2* | 11/2003 | Wang | H01J 37/321 |
| | | | 156/345.48 |
| 8,438,990 B2* | 5/2013 | Kudela | H01J 37/32091 |
| | | | 156/345.47 |
| 11,515,119 B2 | 11/2022 | Kaneko et al. | |
| 2002/0185228 A1* | 12/2002 | Chen | H01J 37/32174 |
| | | | 156/345.48 |
| 2008/0179181 A1* | 7/2008 | Collins | H01J 37/32174 |
| | | | 204/164 |
| 2010/0080933 A1* | 4/2010 | Kudela | C23C 16/5096 |
| | | | 427/574 |
| 2010/0175831 A1* | 7/2010 | Sasaki | C23C 16/505 |
| | | | 156/345.48 |
| 2010/0243162 A1* | 9/2010 | Koshimizu | H01J 37/32935 |
| | | | 156/345.46 |
| 2011/0003900 A1* | 1/2011 | Yagi | C10G 49/00 |
| | | | 518/704 |
| 2012/0248066 A1* | 10/2012 | Yamazawa | H01J 37/32174 |
| | | | 216/68 |
| 2018/0041183 A1* | 2/2018 | Mavretic | H01L 21/02274 |
| 2019/0115191 A1* | 4/2019 | Mavretic | H01L 29/861 |
| 2019/0267212 A1* | 8/2019 | Mavretic | H03F 3/24 |
| 2020/0343123 A1* | 10/2020 | Ye | H01L 21/6831 |
| 2023/0124857 A1* | 4/2023 | Choi | H01J 37/321 |
| | | | 216/67 |
| 2023/0411117 A1* | 12/2023 | Choi | H01J 37/3211 |

FOREIGN PATENT DOCUMENTS

| | | | |
|---|---|---|---|
| KR | 10-2007-0033222 | 3/2007 | |
| KR | 10-2016-0012740 | 2/2016 | |
| KR | 10-2021-0030371 | 3/2021 | |
| WO | WO-02084698 A1 * | 10/2002 | H01J 37/32 |

* cited by examiner

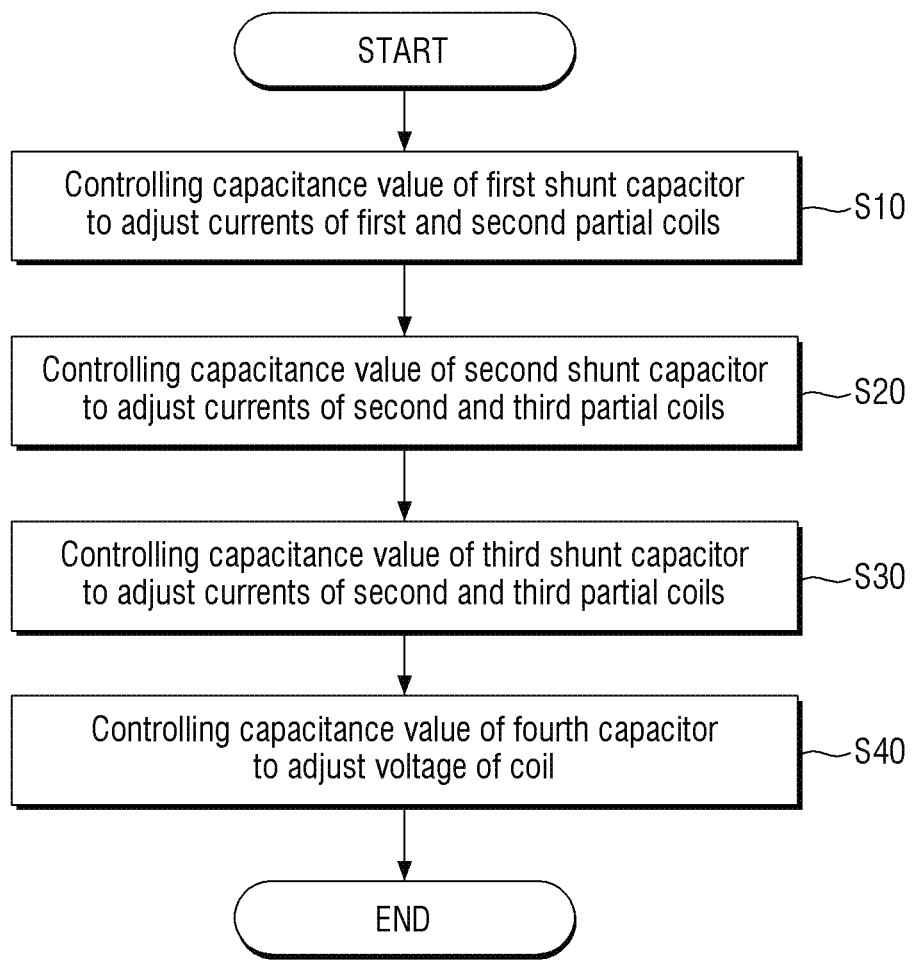

PLASMA PROCESSING APPARATUS AND PLASMA PROCESSING METHOD USING THE SAME

CROSS-REFERENCE TO RELATED APPLICATION

This application claims priority from Korean Patent Application No. 10-2021-0139978 filed on Oct. 20, 2021 in the Korean Intellectual Property Office, and all the benefits accruing therefrom under 35 U.S.C. 119, the contents of which in its entirety are herein incorporated by reference.

BACKGROUND

Field

The present disclosure relates to a plasma processing apparatus and a plasma processing method using the same.

Description of Related Art

When manufacturing a semiconductor device or a display device, various processes using plasma, for example, etching, ashing, ion implantation, cleaning, etc. may be used. A substrate processing apparatus using plasma may be classified into CCP (Capacitively Coupled Plasma) type and ICP (Inductively Coupled Plasma) type based on a plasma generation scheme. In the CCP type, two electrodes are disposed to face each other in a chamber, and an RF (radio frequency) signal is applied to one or both of the two electrodes to generate an electric field in the chamber to generate plasma. On the other hand, in the ICP type, one or more coils are installed on the chamber, and the RF signal is applied to the coil to induce an electromagnetic field in the chamber to generate plasma.

SUMMARY

A purpose of the present disclosure is to provide a plasma processing apparatus in which one coil-type antenna is divided into a plurality of portions, and a current of the antenna is adjusted via a shunt capacitor connected to each of the plurality of portions to control a plasma density of each of areas corresponding to the plurality of portions.

A purpose of the present disclosure is to provide a plasma processing method in which one coil-type antenna is divided into a plurality of portions, and a current of the antenna is adjusted via a shunt capacitor connected to each of the plurality of portions to control a plasma density of each of areas corresponding to the plurality of portions.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

A first aspect of the present disclosure provides a plasma processing apparatus comprising: a chamber having a processing space defined therein in which plasma is generated; and a plasma generation unit configured to excite gas in the processing space into a plasma state, wherein the plasma generation unit includes: a first power supply to supply power for generation of the plasma; a coil connected to the first power supply; a first shunt capacitor disposed between and connected to a first node of the coil and a ground; and a second shunt capacitor disposed between and connected to a second node other than the first node of the coil and the ground.

In one implementation of the first aspect, the apparatus is configured to control a capacitance value of each of the first and second shunt capacitors to adjust a current of the coil.

In one implementation of the first aspect, the apparatus is configured to adjust a current of the coil to control a density of the plasma.

In one implementation of the first aspect, each of the first and second shunt capacitors includes a variable capacitor.

In one implementation of the first aspect, the coil is divided into first and second partial coils connected in series to each other while the first node is interposed therebetween, wherein the apparatus is configured to control a capacitance value of the first shunt capacitor to adjust currents of the first and second partial coils.

In one implementation of the first aspect, the coil is further divided into a third partial coil connected in series with the second partial coil while the second node is interposed therebetween, wherein the apparatus is configured to control a capacitance value of the second shunt capacitor to adjust currents of the second and third partial coils.

In one implementation of the first aspect, the plasma generation unit further includes a third shunt capacitor disposed between and connected to a third node other than the second node of the coil and the ground, wherein the coil is further divided into a fourth partial coil connected in series with the third partial coil while the third node is interposed therebetween, wherein the apparatus is configured to control a capacitance value of the third shunt capacitor to adjust currents of the third and fourth partial coils.

In one implementation of the first aspect, the plasma generation unit further includes a fourth capacitor disposed between and connected to a fourth node other than the third node of the coil and the ground, wherein the apparatus is configured to control a capacitance value of the fourth capacitor to adjust a voltage of the coil.

In one implementation of the first aspect, the coil includes: a first coil portion having one end connected to the first power supply, wherein the first coil portion is divided into first and second areas; and a second coil portion disposed below the first coil portion and connected to the other end of the first coil portion, wherein the second coil portion is divided into third and fourth areas, wherein each of the first area and the third area constitutes one side half of each of the first and second coil portions while the first area and the third area face vertically each other, wherein each of the second area and the fourth area constitutes the other side half of each of the first and second coil portions while the second area and the fourth area face vertically each other, wherein the apparatus is configured to control capacitance values of the first and third shunt capacitors to adjust currents of the first and fourth areas.

A second aspect of the present disclosure provides a plasma processing apparatus comprising: a chamber having a processing space defined therein for processing a substrate; a support unit disposed in the chamber and supporting the substrate thereon; a gas supply unit for supplying gas to the processing space; and a plasma generation unit configured to excite gas in the processing space into a plasma state, wherein the plasma generation unit includes: a first power supply to supply power for generation of the plasma; a coil connected to the first power supply; and first to third shunt capacitors respectively disposed between and connected to first to third nodes of the coil and a ground.

In one implementation of the second aspect, the coil is divided into first to fourth areas, wherein the first node is disposed between the first and second areas, the second node is disposed between the second and third areas, and the third node is disposed between the third and fourth areas, wherein the apparatus is configured to control capacitance values of the first to third shunt capacitors to adjust currents of the second to fourth areas.

In one implementation of the second aspect, the plasma generation unit, further includes a fourth capacitor disposed between and connected to a fourth node other than the third node of the coil and the ground, wherein the apparatus is configured to control a capacitance value of the fourth capacitor to adjust a voltage of the coil.

A third aspect of the present disclosure provides a plasma processing apparatus comprising: a chamber having a processing space defined therein in which plasma is generated; and a plasma generation unit configured to excite gas in the processing space into a plasma state, wherein the plasma generation unit includes: a first power supply to supply power for generation of the plasma; a first coil portion having one end connected to the first power supply, wherein the first coil portion is divided into first and second areas; a second coil portion disposed under the first coil portion, and connected to the other end of the first coil portion, wherein the second coil portion is divided into third and fourth areas; and first to third shunt capacitors and a fourth capacitor respectively disposed between and connected to the first to fourth areas and a ground.

In one implementation of the third aspect, each of the first area and the third area constitutes one side half of each of the first and second coil portions while the first area and the third area face vertically each other, wherein each of the second area and the fourth area constitutes the other side half of each of the first and second coil portions while the second area and the fourth area face vertically each other.

In one implementation of the third aspect, the apparatus is configured to control capacitance values of the first and third shunt capacitors to adjust currents of the first and fourth areas.

In one implementation of the third aspect, the apparatus is configured to adjust currents of the first and fourth areas to control a density of the plasma.

A fourth aspect of the present disclosure provides a plasma processing method using a plasma processing apparatus, wherein the apparatus includes: a chamber having a processing space defined therein for processing a substrate; a support unit disposed in the chamber and supporting the substrate thereon; a gas supply unit for supplying gas to the processing space; and a plasma generation unit configured to excite gas in the processing space into a plasma state, wherein the plasma generation unit includes: a first power supply to supply power for generation of the plasma; a coil connected to the first power supply; and first to third shunt capacitors respectively disposed between and connected to first to third nodes of the coil and a ground, wherein the plasma processing method includes controlling capacitance values of the first to third shunt capacitors to adjust a current of the coil.

In one implementation of the fourth aspect, the coil is divided into first to fourth partial coils, wherein the first node is disposed between the first and second partial coils, the second node is disposed between the second and third partial coils, and the third node is disposed between the third and fourth partial coils, wherein the plasma processing method includes: controlling a capacitance value of the first shunt capacitor to adjust currents of the first and second partial coils; controlling a capacitance value of the second shunt capacitor to adjust currents of the second and third partial coils; and controlling a capacitance value of the third shunt capacitor to adjust currents of the third and fourth partial coils.

In one implementation of the fourth aspect, the plasma generation unit further includes a fourth capacitor disposed between and connected to a fourth node other than the third node of the coil and the ground, wherein the plasma processing method further includes controlling a capacitance value of the fourth capacitor to adjust a voltage of the coil.

In one implementation of the fourth aspect, the plasma processing method includes adjusting a current of the coil to control a density of the plasma.

The specific details of other embodiments are included in the detailed description and drawings.

BRIEF DESCRIPTION OF DRAWINGS

The above and other aspects and features of the present disclosure will become more apparent by describing in detail exemplary embodiments thereof with reference to the attached drawings, in which:

FIG. 5 is a flowchart for illustrating a plasma processing method according to some embodiments of the present disclosure.

DETAILED DESCRIPTIONS

Figure 1:
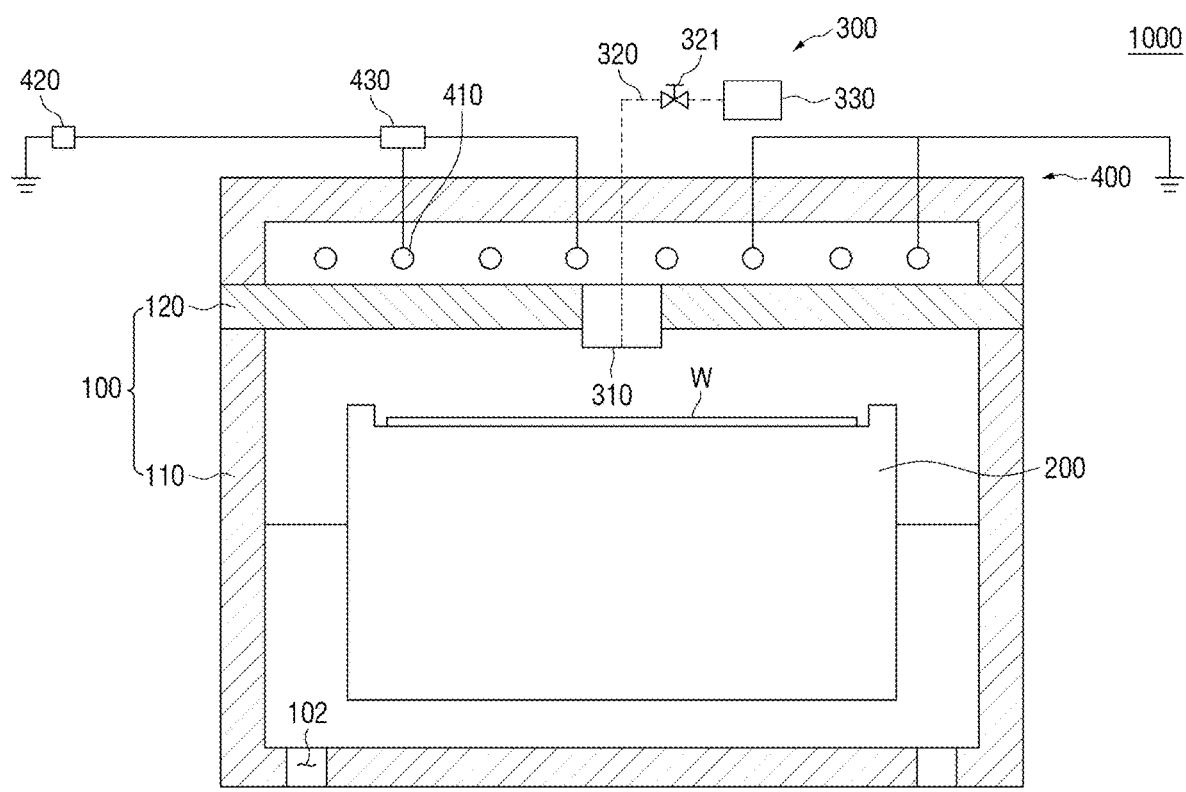
FIG. 1 is an exemplary diagram for illustrating a plasma processing apparatus according to some embodiments of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may be actually executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Figure 2:
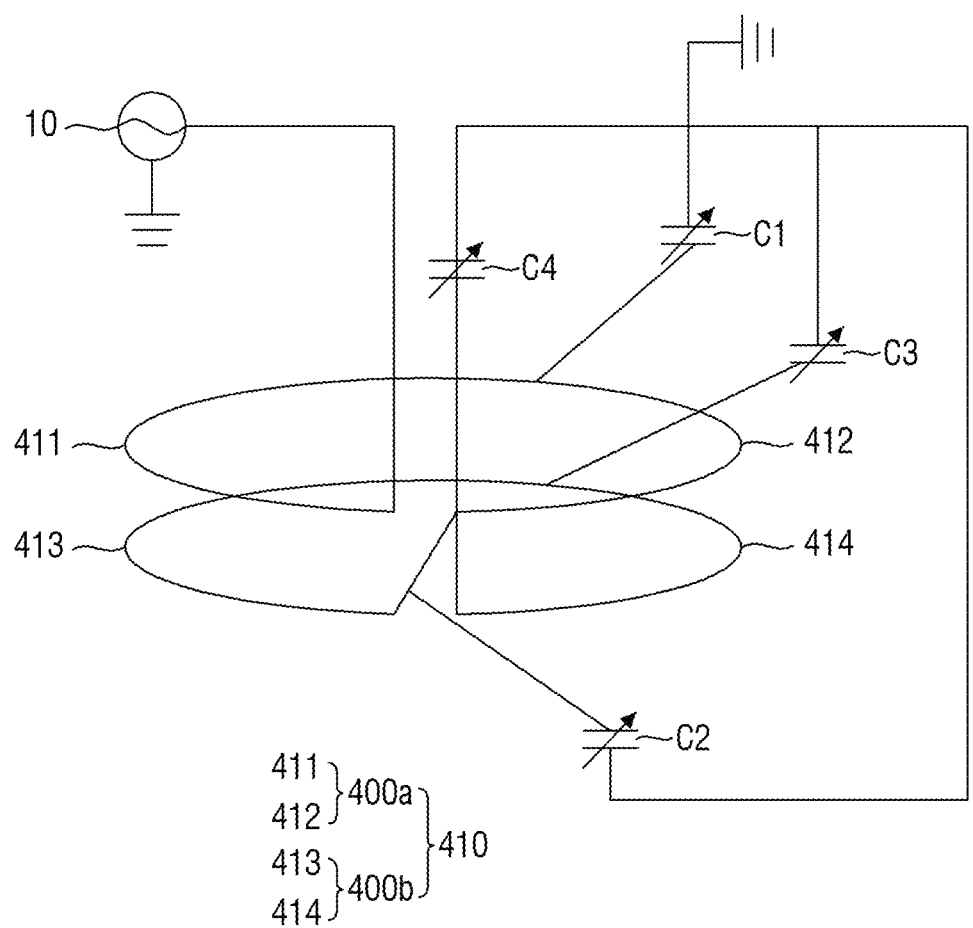
FIG. 2 is an exemplary diagram for illustrating an antenna of the plasma processing apparatus of FIG. 1.
Figure 3:
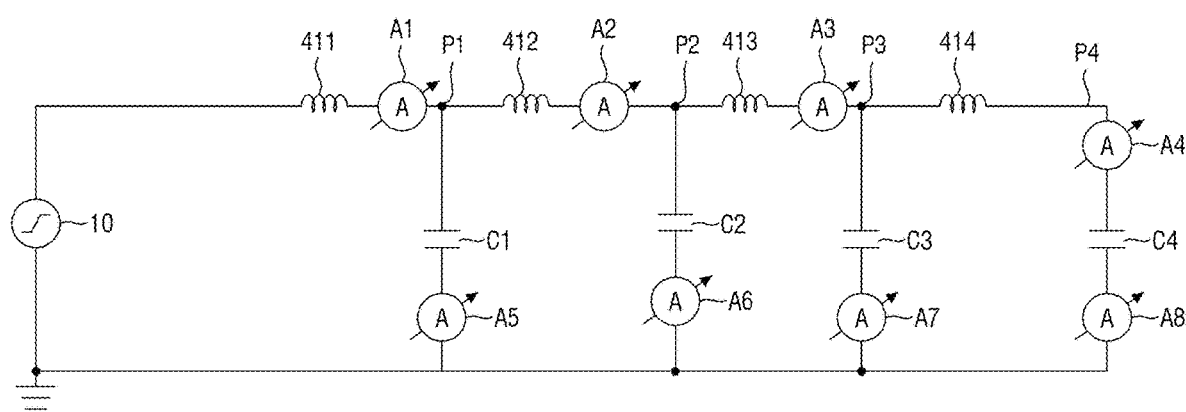
FIG. 3 is a circuit diagram for illustrating an equivalent circuit of the antenna in FIG. 2.
Figure 4:
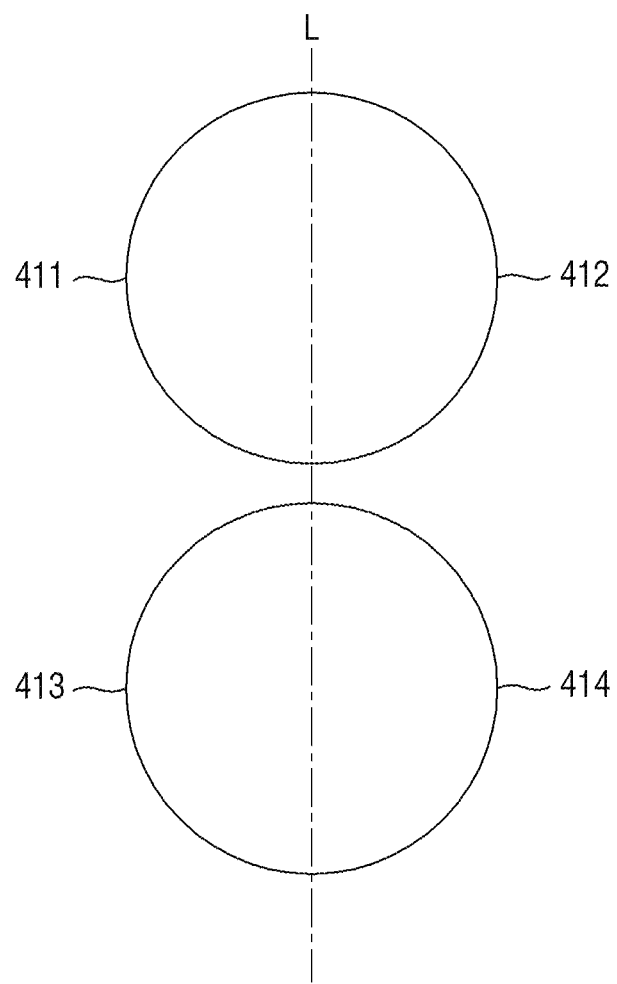
FIG. 4 is an exemplary view showing an upper partial coil and a lower partial coil of the antenna of FIG. 2.

FIG. 1 is an exemplary diagram for illustrating a plasma processing apparatus according to some embodiments of the present disclosure. FIG. 2 is an exemplary diagram for illustrating an antenna of the plasma processing apparatus of FIG. 1. FIG. 3 is a circuit diagram for illustrating an equivalent circuit of the antenna in FIG. 2. FIG. 4 is an exemplary view showing an upper partial coil and a lower partial coil of the antenna of FIG. 2.

First, referring to FIGS. 2 and 3, a plasma generation unit 400 according to some embodiments includes a first power supply 10, a coil 410, first to third shunt capacitors C1, C2, and C3, and a fourth capacitor C4.

The first power supply 10 supplies power for plasma generation. The first power supply 10 may supply high-frequency power.

The coil 410 may be connected to the first power supply 10 to generate plasma in a chamber 100. The coil 410 may be embodied as a coil-type antenna for generating plasma.

Referring to FIG. 3, the coil 410 may be divided into a plurality of portions based on a position. The coil 410 may have a first node P1 receiving an RF signal. Specifically, the coil 410 may be divided into first, second, third, and fourth partial coils 411, 412, 413 and 414. In this regard, the first and second partial coils 411 and 412 are connected in series to each other while the first node P1 is interposed therebetween. The second and third partial coils 412 and 413 are connected in series to each other while a second node P2 is interposed therebetween. The third and fourth partial coils 413 and 414 are connected in series to each other while a third node P3 is interposed therebetween.

In some embodiments, the first to fourth partial coils 411, 412, 413, and 414 of the coil 410 may be referred to as first to fourth areas, respectively.

The first to third shunt capacitors C1, C2, and C3 and the fourth capacitor C4 are connected to the first to fourth partial coils 411, 412, 413, and 414 of the coil 410, respectively.

Specifically, the first shunt capacitor C1 is connected to and disposed between the first node P1 of the coil 410 and a ground. The second shunt capacitor C2 is connected to and disposed between the second node P2 other than the first node P1 and the ground. The third shunt capacitor C3 is connected to and disposed between the third node P3 other than the second node P2 and the ground. The fourth capacitor C4 is connected to and disposed between and a fourth node P4 other than the third node P3 and the ground.

In some embodiments, each of the first to third shunt capacitors C1, C2, and C3 may be embodied as a variable capacitor. The fourth capacitor C4 may act as a balance capacitor.

Specifically, currents of the first and second partial coils 411 and 412 may be adjusted by controlling a capacitance value of the first shunt capacitor C1. Currents of the second and third partial coils 412 and 413 may be adjusted by controlling a capacitance value of the second shunt capacitor C2. Currents of the third and fourth partial coils 413 and 414 may be adjusted by controlling a capacitance value of the third shunt capacitor C3.

The fourth capacitor C4 may play a role in adjusting a voltage of the coil 410. When the fourth capacitor C4 has a specific capacitance value, the voltage of the coil 410 may be adjusted by making a voltage at a center of the coil 410 become 0V. In this case, the center of the coil 410 may refer to a point at which a voltage of a node of the second shunt capacitor C2 becomes 0V, and may mean a point at which a sign of the voltage of the coil 410 changes. The center of the coil 410 may mean a point between the first area 411 and the third area 413 arranged at a left side and the second area 412 and the fourth area 414 arranged at a right side around a imaginary line L of FIG. 4.

Referring to FIG. 2 and FIG. 4, the coil 410 includes a first coil portion 400a having an end connected to the first power supply 10 and divided into the first and second areas 411 and 412, and a second coil portion 400b disposed below the first coil portion 400a and connected to the other end of the first coil portion 400a and divided into the third and fourth area 413 and 414. In this case, the first coil portion 400a may mean an upper coil, while the second coil portion 400b may mean a lower coil.

Each of the first area 411 and the third area 413 may constitute one half of each of the first and second coils 400a and 400b and may face each other. Each of the second area 412 and the fourth area 414 may constitute the other half of each of the first and second coils 400a and 400b and may face each other. In this case, each of the first area 411 and the third area 413 may constitute a left half of each of the first and second coils 400a and 400b around the imaginary line L in FIG. 4. Each of the second area 412 and the fourth area 414 may constitute a right half of each of the first and second coils 400a and 400b around the imaginary line L in FIG. 4. A location of the imaginary line L is not limited to that as shown in FIG. 4.

Referring to Tables 1 and 2 below, a magnitude of the current of each of the first to fourth areas 411, 412, 413, and 414 may vary depending on each of the capacitance values of the first to third shunt capacitors C1, C2, and C3 and the fourth capacitor C4.

In other words, the magnitude of the current of each of the first to third shunt capacitors C1, C2, and C3 and the fourth capacitor C4 as measured via fifth to seventh ammeters A5, A6, and A7 may vary based on each of the capacitance values of the first to third shunt capacitors C1, C2, and C3 and the fourth capacitor C4. As the magnitude of the current of each of the first to third shunt capacitors C1, C2, and C3 varies, the magnitude of the current of each of the first to fourth areas 411, 412, 413, 414 of the coil 410 as measured via first to fourth ammeters A1, A2, A3, and A4 may vary.

Specifically, as the capacitance of each of the first to third shunt capacitors C1, C2, and C3 increases, the magnitude of the current of each of the first to third shunt capacitors C1, C2, and C3 may increase, so that the magnitude of the current of the coil 410 may decrease.

On the contrary, as the capacitance of each of the first to third shunt capacitors C1, C2, and C3 decreases, the magnitude of the current of each of the first to third shunt capacitors C1, C2, and C3 may decrease, so that the magnitude of the current of the coil 410 may increase.

For example, referring to Table 1, it may be identified that in Present Example 1, the capacitance value of the first shunt capacitor C1 increases compared to Comparative Example. Referring to Table 2, it may be identified that as the magnitude of the current of the first shunt capacitor C1 as measured via the fifth ammeter A5 increases compared to the Comparative Example, the magnitude of the current of the first area 411 as measured via the first ammeter A1 decreases compared to the Comparative Example, and the magnitude of the current of the second area 412 measured via the second ammeter A2 increases compared to the Comparative Example.

In Present Example 2, as the capacitance value of the first shunt capacitor C1 increases compared to Present Example 1, the magnitude of the current of the first area 411 may decrease compared to Present Example 1. In this case, the magnitude of the current of the first area 411 may be adjusted to be smaller than the magnitude of the current of each of the second to fourth areas 412, 413, and 414, so that the plasma density of the first area 411 may be reduced.

It may be identified that, in each of Present Example 3 and Present Example 4, the capacitance value of the second shunt capacitor C2 increases compared to the Comparative Example. This may indicate that each of voltages of the first area 411 and the third area 413 disposed at the left side around the imaginary line and each of the voltages of the second area 412 and the fourth area 414 disposed at the right around the line are balanced with each other. In this case, it may be identified that there is little change in the magnitude of the current based on the capacitance value of the second shunt capacitor C2.

It may be identified that in each of Present Example 5 and Present Example 6, the capacitance value of the third shunt capacitor C3 increases compared to the Comparative Example. It may be identified that as the capacitance value of the third shunt capacitor C3 increases compared to the Comparative Example, the magnitude of the current of the fourth area 414 decreases compared to the Comparative Example, which is not the case in Present Example 1 and Present Example 2. Accordingly, the plasma density of each of the fourth areas 412, 413, and 414 may be reduced.

As described above, the first area 411 constitutes the left area of the coil 410, and the fourth area 414 constitutes the right area of the coil 410. In this case, adjusting the capacitance values of the first and third shunt capacitors C1 and C3 may allow the magnitude of the current of each of the left area and the right area of the coil 410 to be adjusted to a desired value. As a result, the plasma density of each of the left and right areas of the coil 410 may be adjusted.

More specifically, referring to Table 2 and FIG. 4 together, the magnitude of the currents of the left area and the right area of the coil 410 may be adjusted to be equal to each other. Alternatively, the magnitude of the current of one of the left area and the right area of the coil 410 may be adjusted to larger than the magnitude of the current of the other of the left area and the right area of the coil 410.

In the Comparative Example, a sum of the magnitudes of the currents of the first and the third areas 411 and 413 constituting the left area of the coil 410 is 1166 mA and thus is equal to a sum of the magnitudes of the currents of the second and fourth areas 412 and 414 constituting the right area of the coil 410.

In the Present Example 1, the sum of the magnitudes of the currents of the first and third areas 411 and 413 constituting the left area of the coil 410 is 1169 mA, while the sum of the magnitudes of the currents of the second and fourth areas 412 and 414 constituting the right area of the coil 410 is 1206 mA. In this case, the magnitude of the current of the right area of the coil 410 may be adjusted to be relatively larger.

In the Present Example 2, the sum of the magnitudes of the currents of the first and third areas 411 and 413 constituting the left area of the coil 410 is 1183 mA, while the sum of the magnitudes of the currents of the second and fourth areas 412 and 414 constituting the right area of the coil 410 is 1418 mA. In this case, the magnitude of the current of the right area of the coil 410 may be adjusted to be relatively larger compared to the Present Example 1.

In the Present Example 3, the sum of the magnitudes of the currents of the first and the third areas 411 and 413 constituting the left area of the coil 410 is 1166 mA and thus is equal to the sum of the magnitudes of the currents of the second and fourth areas 412 and 414 constituting the right area of the coil 410.

In the Present Example 4, the sum of the magnitudes of the currents of the first and third areas 411 and 413 constituting the left area of the coil 410 is 1166 mA, while the sum of the magnitudes of the currents of the second and fourth areas 412 and 414 constituting the right area of the coil 410 is 1167 mA. In this case, the sum of the magnitudes of the currents of the first and third areas 411 and 413 constituting the left area of the coil 410 is substantially equal to the sum of the magnitudes of the currents of the second and fourth areas 412 and 414 constituting the right area of the coil 410.

In the Present Example 5, the sum of the magnitudes of the currents of the first and third areas 411 and 413 constituting the left area of the coil 410 is 1138 mA, while the sum of the magnitudes of the currents of the second and fourth areas 412 and 414 constituting the right area of the coil 410 is 1105 mA. In this case, the magnitude of the current of the left area of the coil 410 may be adjusted to be relatively larger.

In the Present Example 6, the sum of the magnitudes of the currents of the first and third areas 411 and 413 constituting the left area of the coil 410 is 1049 mA, while the sum of the magnitudes of the currents of the second and fourth areas 412 and 414 constituting the right area of the coil 410 is 921 mA. In this case, the magnitude of the current of the left area of the coil 410 may be adjusted to be relatively larger compared to the Present Example 5.

That is, adjusting the capacitance values of the first to third shunt capacitors C1, C2, and C3 may allow the magnitude of the current of the coil 410 to be freely controlled based on each of the areas of the coil 410. As a result, the plasma density of the coil 410 may be freely controlled based on each of the areas of the coil 410.

TABLE 1

| | Comparative Example | Present Example 1 | Present Example 2 | Present Example 3 | Present Example 4 | Present Example 5 | Present Example 6 |
|---|---|---|---|---|---|---|---|
| First area 411 | 1 μH | 1 μH | 1 μH | 1 μH | 1 μH | 1 μH | 1 μH |
| Second area 412 | 1 μH | 1 μH | 1 μH | 1 μH | 1 μH | 1 μH | 1 μH |
| Third area 413 | 1 μH | 1 μH | 1 μH | 1 μH | 1 uH | 1 μH | 1 μH |
| Fourth area 414 | 1 μH | 1 μH | 1 μH | 1 μH | 1 μH | 1 μH | 1 μH |
| First shunt capacitor C1 | 1 pF | 10 pF | 50 pF | 1 pF | 1 pF | 1 pF | 1 pF |
| Second shunt capacitor C2 | 1 pF | 1 pF | 1 pF | 10 pF | 50 pF | 1 pF | 1 pF |
| Third shunt capacitor C3 | 1 pF | 1 pF | 1 pF | 1 pF | 1 pF | 10 pF | 50 pF |
| Fourth capacitor C4 | 75 pF | 75 pF | 75 pF | 75 pF | 75 pF | 75 pF | 75 pF |

TABLE 2

|  | Comparative Example | Present Example 1 | Present Example 2 | Present Example 3 | Present Example 4 | Present Example 5 | Present Example 6 |
|---|---|---|---|---|---|---|---|
| First ammeter A1 | 581 mA | 564 mA | 472 mA | 581 mA | 581 mA | 567 mA | 522 mA |
| Second ammeter A2 | 585 mA | 605 mA | 711 mA | 585 mA | 585 mA | 570 mA | 526 mA |
| Third ammeter A3 | 585 mA | 605 mA | 711 mA | 585 mA | 586 mA | 571 mA | 527 mA |
| Fourth ammeter A4 | 581 mA | 601 mA | 707 mA | 581 mA | 582 mA | 535 mA | 395 mA |
| Fifth ammeter A5 | 4 mA | 40 mA | 239 mA | 4 mA | 4 mA | 4 mA | 4 mA |
| Sixth ammeter A6 | 0 | 0 | 0 | 0 | 2 mA | 0 | 1 mA |
| Seventh ammeter A7 | 4 mA | 4 mA | 5 mA | 4 mA | 4 mA | 36 mA | 132 mA |

FIG. 5 is a flowchart for illustrating a plasma processing method according to some embodiments of the present disclosure. For convenience of description, a following description is mainly based on differences from the descriptions using FIG. 1 to FIG. 4.

A plasma processing apparatus according to some embodiments includes a chamber 100, a support unit 200, a gas supply unit 300 and the plasma generation unit 400.

The plasma generation unit 400 includes the first power supply 10 that supplies the power for plasma generation, the coil 410 connected to the first power supply 10, and the first to third shunt capacitors C1, C2, and C3 respectively connected to and disposed between the first to third nodes P1, P2, and P3 and the ground.

In the plasma processing apparatus according to some embodiments, the current of the coil 410 may be adjusted by controlling the capacitance values of the first to third shunt capacitors C1, C2, and C3.

Referring to FIG. 3 and FIG. 5, the currents of the first and second partial coils 411 and 412 is adjusted by controlling the capacitance value of the first shunt capacitor C1 in S10.

The currents of the second and third partial coils 412 and 413 is adjusted by controlling the capacitance value of the second shunt capacitor C2 in S20.

The currents of the third and fourth partial coils 413 and 414 is adjusted by controlling the capacitance value of the third shunt capacitor C3 in S30.

The plasma generation unit 400 includes the fourth capacitor C4 connected to and disposed between the fourth node P4 other than the third node P3 and the ground. The voltage of the entirety of the coil 410 is adjusted by controlling the capacitance value of the fourth capacitor C4 in S40.

In some embodiments, each of the first to third shunt capacitors C1, C2, and C3 may be embodied as a variable capacitor, and the fourth capacitor C4 may be embodied as a balance capacitor.

That is, the capacitance values of the first to third shunt capacitors C1, C2, and C3 and the fourth capacitor C4 may be adjusted such that the magnitude of the current of the coil 410 may be freely controlled based on each of the areas of the coil 410. As a result, the plasma density of coil 410 may be freely controlled based on each of the areas of the coil 410.

FIG. 1 is an exemplary cross-sectional view for illustrating a plasma processing apparatus according to some embodiments of the present disclosure. FIG. 1 illustrates a plasma processing apparatus for generating plasma in an ICP (Inductively Coupled Plasma) scheme by way of example. However, the disclosure is not limited thereto.

Referring to FIG. 1, a plasma processing apparatus 1000 according to some embodiments of the present disclosure may act as a substrate processing apparatus that processes a substrate W using plasma. For example, the plasma processing apparatus 1000 may perform an etching process on the substrate W. The plasma processing apparatus 1000 may include a chamber 100, a support unit 200, a gas supply unit 300, and a plasma generation unit 400.

The chamber 100 provides a space where the substrate processing process is performed. The chamber 100 includes a housing 110 and a sealing cover 120.

The housing 110 has an inner space having an open top. The inner space of the housing 110 serves as a processing space where the substrate processing process is performed. The housing 110 may be made of a metal material. The housing 110 may be made of an aluminum material. The housing 110 may be grounded. An exhaust hole 102 is formed in a bottom face of the housing 110, so that reaction by-products generated in the process and gas staying in the inner space of the housing may be discharged to an outside. The inside of the housing 110 is decompressed to a predetermined pressure by the exhaust process.

The sealing cover 120 covers the open top of the housing 110. The sealing cover 120 is formed in a shape of a plate and seals the inner space of the housing 110. The sealing cover 120 may include a dielectric material window.

The support unit 200 is located inside the housing 110. The support unit 200 supports the substrate W thereon. The support unit 200 may include an electrostatic chuck that adsorbs the substrate W using electrostatic force. Alternatively, the support unit 200 may support the substrate W in various schemes such as mechanical clamping.

The support unit 200 may be positioned inside the chamber 100 and may be spaced upwardly from a bottom face of the housing 110.

The gas supply unit 300 supplies a process gas into the chamber 100. The gas supply unit 300 includes a gas supply nozzle 310, a gas supply line 320 and gas storage 330. The gas supply nozzle 310 is installed in a center of the sealing cover 120. An injection hole is formed in a bottom of the gas supply nozzle 310. The injection hole is located under the sealing cover 120 and supplies the process gas to the processing space inside the chamber 100. The gas supply line 320 connects the gas supply nozzle 310 to the gas storage 330. The gas supply line 320 supplies the process gas stored in the gas storage 330 to the gas supply nozzle 310. A valve 321 is installed on the gas supply line 320. The valve 321 opens and closes the gas supply line 320, and adjusts a flow rate of the process gas to be supplied via the gas supply line 320.

The plasma generation unit 400 excites the process gas in the chamber 100 into a plasma state. According to one embodiment of the present disclosure, the plasma generation unit 400 may be of an ICP type.

The plasma generation unit 400 may include a high-frequency power supply device 420, the antenna 410, and a power distributor 430. The high-frequency power supply device 420 supplies a high-frequency signal, that is, an RF signal. The high frequency power supply device 420 may include the first power supply 10 as described using FIG. 1 to FIG. 4. Although not specifically illustrated, the high-frequency power supply device 420 may further include an impedance matching system.

The antenna 410 is connected in series with the high frequency power supply device 420. The antenna 410 may be embodied as a coil having multiple turns. The antenna 410 is electrically connected to the high frequency power supply device 420 and receives a RF power therefrom. The power distributor 430 distributes the power supplied from the high frequency power supply device 420 to the antenna 410.

The antenna 410 may face the substrate W. For example, the antenna 410 may be installed on a top face of the chamber 100. The antenna 410 may be formed in a ring shape. In this regard, the antenna 410 may be embodied as a plurality of rings having different radii.

According to an embodiment, the antenna 410 may be disposed on a top face of the chamber 100, or may be disposed on a side face of the chamber 100. As long as the antenna 410 generates the plasma within the chamber 100, a position of the coil is not limited to a specific position.

The antenna 410 may receive the RF power from the high-frequency power supply device 420 to induce a time-varying electromagnetic field in the chamber. Accordingly, the process gas supplied to the chamber 100 may be excited to the plasma.

Although the embodiments of the present disclosure have been described with reference to the accompanying drawings, a person with ordinary skill in the technical field to which the present disclosure belongs will appreciate that the present disclosure may be implemented in various forms without changing technical idea or essential features thereof. Therefore, it should be understood that the embodiments as described above are illustrative in all respects and not restrictive.

What is claimed is:

1. A plasma processing apparatus comprising:
a chamber having a processing space defined therein in which plasma is generated; and
a plasma generation unit configured to excite gas in the processing space into a plasma state,
wherein the plasma generation unit includes:
a first power supply to supply power for generation of the plasma;
a coil connected to the first power supply;
a first shunt capacitor connected between a first node of the coil and a ground; and
a second shunt capacitor connected between a second node other than the first node of the coil and the ground,
wherein:
the coil comprises a first partial coil and a second partial coil connected in series to each other,
one end of the first partial coil is connected to the first power supply and another end of the first partial coil is connected to the first node of the coil connected to the first shunt capacitor, and
one end of the second partial coil is connected to the first node of the coil connected to the first shunt capacitor and another end of the second partial coil is connected to the second node of the coil connected to the second shunt capacitor.

2. The plasma processing apparatus of claim 1, wherein the apparatus is configured to control a capacitance value of each of the first and second shunt capacitors to adjust a current of the coil.

3. The plasma processing apparatus of claim 1, wherein the apparatus is configured to adjust a current of the coil to control a density of the plasma.

4. The plasma processing apparatus of claim 1, wherein each of the first and second shunt capacitors includes a variable capacitor.

5. The plasma processing apparatus of claim 1, wherein the first node is interposed between the first partial coil and the second partial coil,
wherein the apparatus is configured to control a capacitance value of the first shunt capacitor to adjust currents of the first and second partial coils.

6. The plasma processing apparatus of claim 5, wherein the coil is further divided into a third partial coil connected in series with the second partial coil while the second node is interposed therebetween,
wherein the apparatus is configured to control a capacitance value of the second shunt capacitor to adjust currents of the second and third partial coils.

7. The plasma processing apparatus of claim 6, wherein the plasma generation unit further includes a third shunt capacitor disposed between and connected to a third node other than the second node of the coil and the ground,
wherein the coil is further divided into a fourth partial coil connected in series with the third partial coil while the third node is interposed therebetween,
wherein the apparatus is configured to control a capacitance value of the third shunt capacitor to adjust currents of the third and fourth partial coils.

8. The plasma processing apparatus of claim 7, wherein the plasma generation unit further includes a fourth capacitor disposed between and connected to a fourth node other than the third node of the coil and the ground,
wherein the apparatus is configured to control a capacitance value of the fourth capacitor to adjust a voltage of the coil.

9. The plasma processing apparatus of claim 1, wherein the coil includes:
a first coil portion having one end connected to the first power supply, wherein the first coil portion is divided into first and second areas; and
a second coil portion disposed below the first coil portion and connected to the other end of the first coil portion, wherein the second coil portion is divided into third and fourth areas,
wherein each of the first area and the third area constitutes one side half of each of the first and second coil portions while the first area and the third area face vertically each other,
wherein each of the second area and the fourth area constitutes the other side half of each of the first and second coil portions while the second area and the fourth area face vertically each other,
wherein the apparatus is configured to control capacitance values of the first and third shunt capacitors to adjust currents of the first and fourth areas.

10. A plasma processing apparatus comprising:
a chamber having a processing space defined therein in which plasma is generated; and
a plasma generation unit configured to excite gas in the processing space into a plasma state, wherein the plasma generation unit includes:
a first power supply to supply power for generation of the plasma;
a first coil portion having one end connected to the first power supply, wherein the first coil portion is divided into first and second areas;
a second coil portion disposed under the first coil portion, and connected to the other end of the first coil portion, wherein the second coil portion is divided into third and fourth areas; and
first to third shunt capacitors and a fourth capacitor connected between the first to fourth areas and a ground, respectively.

11. The plasma processing apparatus of claim 10, wherein each of the first area and the third area constitutes one side half of each of the first and second coil portions while the first area and the third area face vertically each other,
wherein each of the second area and the fourth area constitutes the other side half of each of the first and second coil portions while the second area and the fourth area face vertically each other.

12. The plasma processing apparatus of claim 10, wherein the apparatus is configured to control capacitance values of the first and third shunt capacitors to adjust currents of the first and fourth areas.

13. The plasma processing apparatus of claim 12, wherein the apparatus is configured to adjust currents of the first and fourth areas to control a density of the plasma.

* * * * *